(12) United States Patent
Lee

(10) Patent No.: US 9,159,748 B2
(45) Date of Patent: Oct. 13, 2015

(54) SUBSTRATE FOR DISPLAY DEVICE AND METHOD OF FABRICATING THE SAME

(71) Applicant: LG DISPLAY CO., LTD., Seoul (KR)

(72) Inventor: Seung-Ryong Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 70 days.

(21) Appl. No.: 13/939,021

(22) Filed: Jul. 10, 2013

(65) Prior Publication Data

US 2014/0145217 A1 May 29, 2014

(30) Foreign Application Priority Data

Nov. 28, 2012 (KR) .................. 10-2012-0136134

(51) Int. Cl.
*H01L 27/14* (2006.01)
*H01L 27/12* (2006.01)
*H01L 51/10* (2006.01)

(52) U.S. Cl.
CPC .......... *H01L 27/1248* (2013.01); *H01L 51/107* (2013.01)

(58) Field of Classification Search
None
See application file for complete search history.

(56) References Cited

U.S. PATENT DOCUMENTS

| | | | | |
|---|---|---|---|---|
| 5,169,678 | A * | 12/1992 | Cole et al. | 427/555 |
| 6,359,672 | B2 * | 3/2002 | Gu et al. | 349/138 |
| 2009/0195289 | A1 * | 8/2009 | Subramanian et al. | 327/328 |
| 2010/0068514 | A1 * | 3/2010 | Ellinger et al. | 428/351 |
| 2010/0163878 | A1 * | 7/2010 | Haskal et al. | 257/59 |
| 2010/0276186 | A1 * | 11/2010 | Sasaki et al. | 174/258 |
| 2012/0042694 | A1 * | 2/2012 | Brown et al. | 65/36 |
| 2012/0135251 | A1 * | 5/2012 | Jeong et al. | 428/448 |

* cited by examiner

*Primary Examiner* — Benjamin Sandvik
(74) *Attorney, Agent, or Firm* — Birch, Stewart, Kolasch & Birch, LLP

(57) ABSTRACT

A substrate for a display device including a base substrate; a thin film transistor on the base substrate; a passivation layer of a photosensitive organic material on the thin film transistor, the passivation layer having a contact hole exposing the thin film transistor, the photosensitive organic material including an ultraviolet absorber; and a pixel electrode on the passivation layer, the pixel electrode connected to the thin film transistor through the contact hole.

6 Claims, 4 Drawing Sheets

SUBSTRATE FOR DISPLAY DEVICE AND METHOD OF FABRICATING THE SAME

The present application claims the priority benefit of Korean Patent Application No. 10-2012-0136134 filed in the Republic of Korea on Nov. 28, 2012, which is hereby incorporated by reference in its entirety.

BACKGROUND

1. Field of the Disclosure

The present disclosure relates to a substrate for a display device, and more particularly, to a substrate including a photosensitive organic insulating layer and a method of fabricating the substrate.

2. Discussion of the Related Art

In general, a liquid crystal display (LCD) device may be driven based on optical anisotropy and polarization of liquid crystals (LCs). Since LC molecules are thin and long, the LC molecules may be arranged in a specific direction, and the direction in which the LC molecules are arranged may be controlled by artificially applying an electric field to the LCs.

That is, when the arrangement of the LC molecules is changed using the electric field, light may be refracted due to the optical anisotropy of the LCs in the direction in which the LC molecules are arranged, so that images can be displayed.

In recent years, an active-matrix LCD (AM-LCD) device in which TFTs and pixel electrodes are arranged in matrix shapes has attracted much attention because the device has a high resolution and is highly capable of embodying moving images.

The LCD device includes an array substrate having a pixel electrode, a color filter substrate having a common electrode and a liquid crystal layer interposed between the array substrate and the color filter substrate. The array substrate includes a plurality of pixel regions and a thin film transistor (TFT) is formed in each pixel region. The pixel electrode is connected to the TFT through a contact hole of an insulating layer.

The contact hole may be formed through a photolithographic process including a step of coating a photoresist (PR), a step of forming a PR pattern by exposure and development, and a step of etching an insulating layer using the PR pattern as an etching mask.

A process where a step of coating the PR and a step of etching the insulating layer are omitted by forming the insulating layer between the TFT and the pixel electrode using a photosensitive organic material such as a photo acryl has been researched.

The photosensitive organic material including the PR and the photo acryl may be classified into a positive type and a negative type according to a dissolution property in a developer after exposure. A solubility of an exposed portion of a positive type photosensitive organic material increases so that the exposed portion can be removed after development, while a solubility of an exposed portion of a negative type photosensitive organic material decreases so that an unexposed portion can be removed after development.

The photosensitive organic material is exposed to an ultraviolet (UV) ray emitted from a mercury (Hg) lamp. For example, the photosensitive organic material may be cured by the i-line UV ray of an having a wavelength of about 365 nm. When a pattern of a photo mask has a relatively large size (critical dimension: CD), an influence of diffraction is relatively small so that an influence of a diffracted light can be minimized. However, when a pattern of a photo mask has a relatively small size, a shape of a pattern of the photosensitive organic material may be distorted by the diffracted light.

Specifically, a size of a contact hole in an insulating layer is reduced to improve aperture ratio and brightness of a display device. Deterioration of a fine contact hole due to the diffracted light becomes a serious problem.

SUMMARY OF THE INVENTION

Accordingly, the present invention is directed to a display device that substantially obviates one or more of the problems due to the limitations and disadvantages of the related art.

An object of the present disclosure is to provide a substrate for a display device where aperture ratio and brightness are improved by forming a fine contact hole in an insulating layer of a photosensitive organic material including a UV absorber and a method of fabricating the substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a substrate for a display device including: a base substrate; a thin film transistor on the base substrate; a passivation layer of a photosensitive organic material on the thin film transistor, the passivation layer having a contact hole exposing the thin film transistor, the photosensitive organic material including an ultraviolet absorber; and a pixel electrode on the passivation layer, the pixel electrode connected to the thin film transistor through the contact hole.

In another aspect, there is provided a method of fabricating a substrate for a display device including: forming a thin film transistor on a substrate; forming a passivation layer on the thin film transistor using a photosensitive organic material including an ultraviolet absorber, the passivation layer having a contact hole exposing the thin film transistor; and forming a pixel electrode on the passivation layer, the pixel electrode connected to the thin film transistor through the contact hole.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
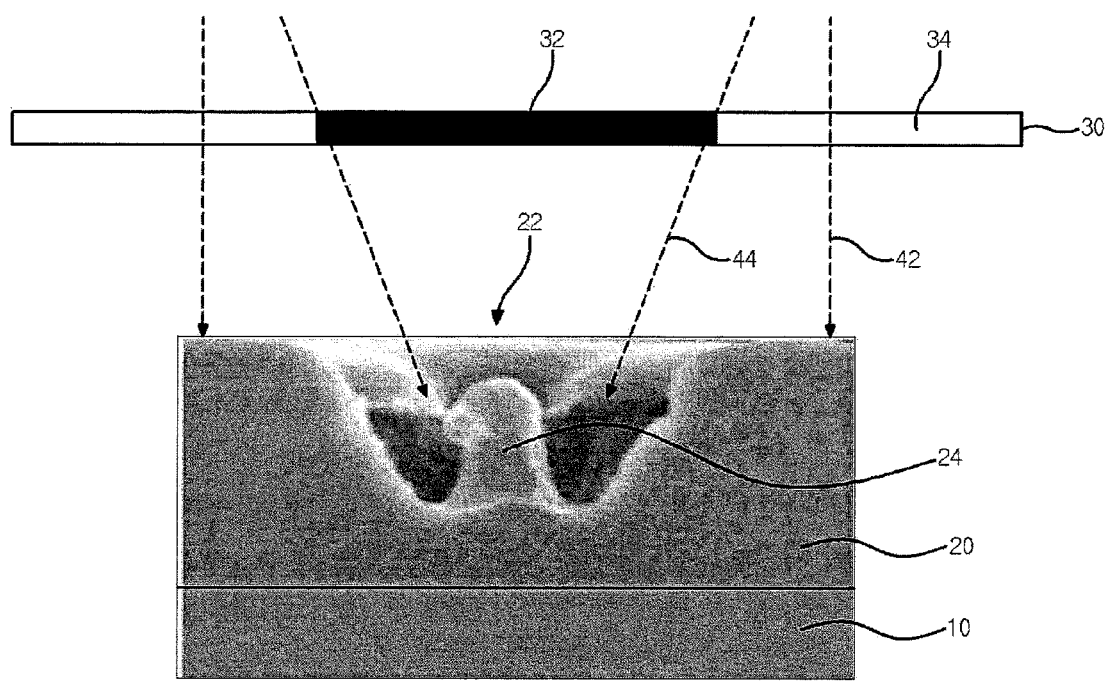
FIG. 1 is a view showing an example of a photo mask and a contact hole of an insulating layer for identifying a residue part in the contact hole according to an embodiment of the present invention.

FIG. 1 is a view showing an example of a photo mask and a contact hole of an insulating layer for identifying a residue part according to an embodiment of the present invention.

In FIG. 1, an insulating layer 20 of a photosensitive organic material is formed on a substrate 10, and a fine contact hole 22 is formed in the insulating layer 20 by irradiating a UV ray onto the insulating layer 20 through a photo mask 30 and developing the exposed insulating layer 20. The photosensitive organic material may have, for example, a negative type. In addition, a blocking area 32 of the photo mask 30 may correspond to the contact hole 22 and a transmissive area 34 of the photo mask 30 may correspond to the other portion of the insulating layer 20 not including the contact hole 22.

The unexposed photosensitive organic material corresponding to the blocking area 32 of the photo mask 30 is removed by development to become the contact hole 22, and the photosensitive organic material exposed to a transmitted light 42 through the transmissive area 34 of the photo mask 30 remains as the insulating layer 20 after the development. Since a diffracted light 44 through the transmissive area 34 of the photo mask 30 is irradiated onto the photosensitive organic material corresponding to a center portion of the blocking area 32 of the photo mask 30, the photosensitive organic material exposed to the diffracted light 44 remains as a residual part 24 in the contact hole 22. However, the creation of the residual part 24 interrupts an electric connection through the contact hole 22 causing deterioration of the display quality of the display device.

Figure 2:
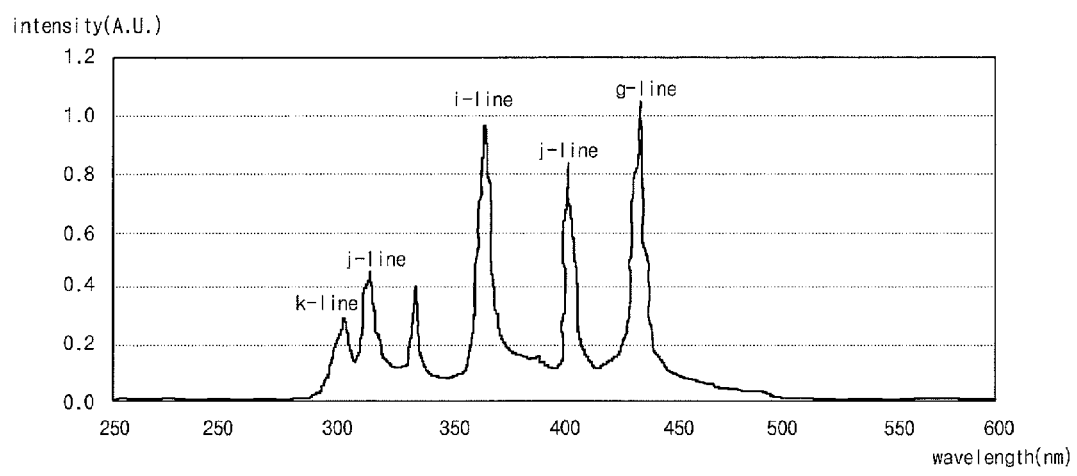
FIG. 2 is a view showing an example of a spectrum of light emitted from a mercury lamp for identifying UV rays causing the residual part in the contact according to an embodiment of the present invention.

FIG. 2 is a view showing an example of a spectrum of light emitted from a mercury lamp for identifying UV rays according to an embodiment of the present invention.

In FIG. 2, light emitted from the mercury lamp includes h-line UV rays having a wavelength of about 405 nm, g-line UV rays having a wavelength of about 436 nm, as well as i-line UV rays having a wavelength of about 365 mm. In accordance with the law of diffraction, as the wavelength of light increases, a distance or an angle to the first bright point of a diffraction pattern increases. As a result, the h-line UV rays having the wavelength of about 405 nm and the g-line UV rays having the wavelength of about 436 nm rather than the i-line UV rays having the wavelength of about 365 mm may impact the center portion of the contact hole 22 (refer to FIG. 1) causing the generation of the residual part 24 (refer to FIG. 1).

In further detail, by analyzing the spectrum of light emitted from the mercury lamp and the generation of the residual part in the contact hole resulting from the light emitted from the mercury lamp, according to the present invention. it can be seen that the residual part is caused by UV rays represented in the spectrum of light. In particular, according to the present invention, the cause of the generation of the residual part can be identified as UV rays emitted from the mercury lamp having wavelengths other than of about 365 nm. In other words, according to the present invention, analyzing UV rays emitted from the mercury lamp reveals that, although the photosensitive organic insulating material is fabricated with i-line UV rays emitted from the mercury lamp having wavelengths of about 365 nm, the light emitted from the mercury lamp also includes g-line and h-line UV rays having longer wavelengths which cause the generation of the residual part.

Figure 3:
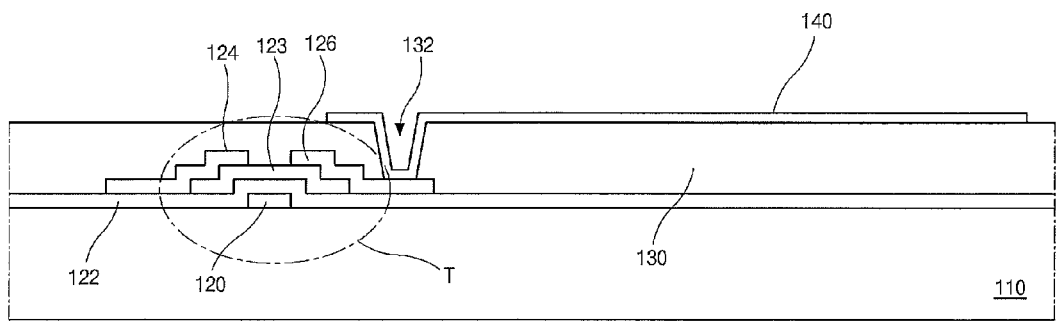
FIG. 3 is a view showing an example of a substrate for a display device according to an embodiment of the present invention.

FIG. 3 is a view showing an example of a substrate for a display device according to an embodiment of the present invention.

In FIG. 3, a thin film transistor (TFT) T and a pixel electrode 140 are formed over a substrate 110 for a display device according to an embodiment of the present invention. A gate electrode 120 is formed on the substrate 110, and a gate insulating layer 122 is formed on the gate electrode 120. A semiconductor layer 123 is formed on the gate insulating layer 122 over the gate electrode 120, and source and drain electrodes 124 and 126 facing and spaced apart from each other are formed on the semiconductor layer 123. The gate electrode 120, the semiconductor layer 123, the source electrode 124, and the drain electrode 126, for example, constitutes the TFT T.

A passivation layer 130 is formed on the TFT T. The passivation layer 130 has a contact hole 132 exposing the drain electrode 126. A pixel electrode 140 is formed on the passivation layer 130. The pixel electrode 140 is connected to the drain electrode 126 of the TFT T through the contact hole 132. A gate line and a data line crossing each other to define a pixel region are formed over the substrate 110, and the gate electrode 120 and the source electrode 124 of the TFT T are connected to the gate line and the data line, respectively. Accordingly, when a gate signal is applied to the gate electrode 120 through the gate line, the TFT T is turned on and a data signal supplied to the source electrode 124 through the data line is applied to the pixel electrode 140 through the drain electrode 126.

The passivation layer 130 is formed of a photosensitive organic material, and the photosensitive organic material includes a ultraviolet (UV) absorber and a radical scavenger. A method of forming the passivation layer 130 using the photosensitive organic material is illustrated hereinafter.

Figure 4:
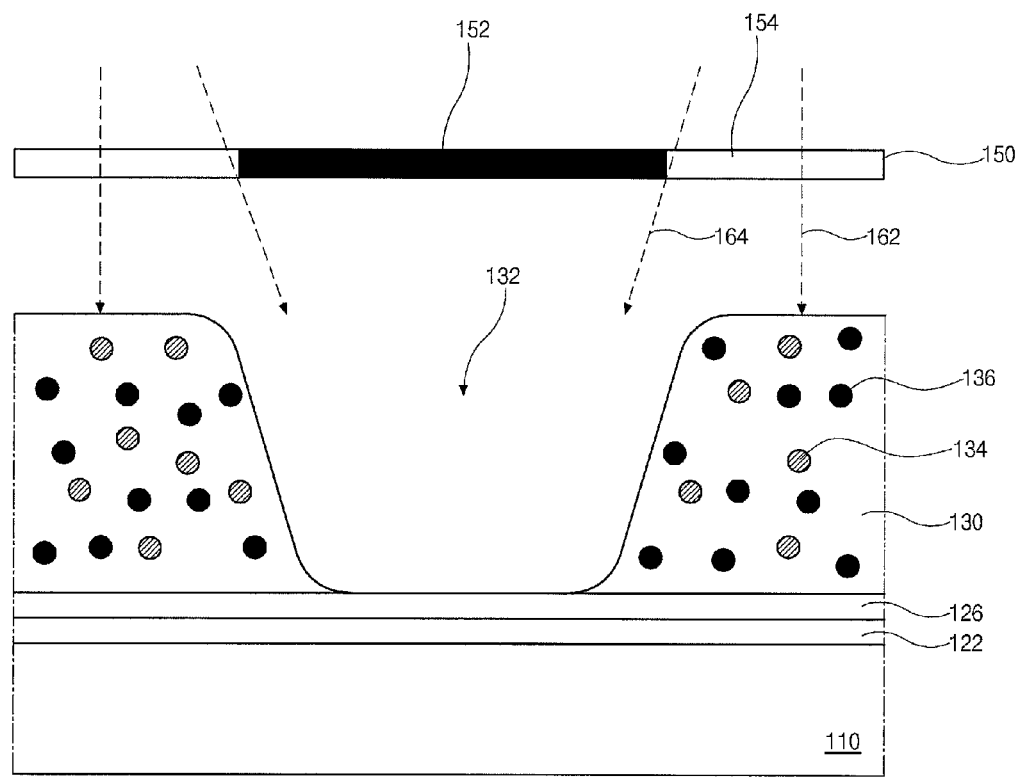
FIG. 4 is a view showing an example of a method of fabricating a substrate for a display device according to an embodiment of the present invention.

FIG. 4 is a view showing an example of a method of fabricating a substrate for a display device according to an embodiment of the present invention.

In FIG. 4, after an insulating layer is formed by coating a photosensitive organic material on a substrate 110, the substrate 110 having the insulating layer is inputted into an exposure apparatus. The photosensitive organic material may have a negative type and the exposure may have a projection type or a proximity type.

In the exposure apparatus, a photo mask 150 having a blocking area 152 and a transmissive area 154 is aligned and disposed over the insulating layer, and UV rays emitted from a light source over the photo mask 150 is irradiated onto the insulating layer through the photo mask 150.

The exposed insulating layer output from the exposure apparatus is developed and the insulating layer corresponding to the blocking area 152 of the photo mask 150 is removed to form a passivation layer 130 having a contact hole 132. After development, an unexposed portion of the photosensitive organic material corresponding to the blocking area 152 of the photo mask 150 is removed to become the contact hole 132, and an exposed portion of the photosensitive organic material to a transmitted light 162 through the transmissive area 154 of the photo mask 150 remains to become the passivation layer 130. As a result, the blocking area 152 of the photo mask 150 corresponds to the contact hole 132 of the passivation layer 130 and the transmissive area 154 of the photo mask 150 corresponds to the other portion of the passivation layer 130 not including the contact hole 132.

For the purpose of preventing the residual part of the photosensitive material at the center portion of the contact hole 132 by a diffracted light 164 through the transmissive area 154 of the photo mask 150, the photosensitive organic material includes a UV absorber 134 and a radical scavenger 136.

For example, the photosensitive organic material may be fabricated by adding the UV absorber 134 and the radical scavenger 136 to a photoinitiator, a crosslinker, and a binder. The photoinitiator may absorb the UV rays to generate a free radical, and the crosslinker may combine the free radical generated from the photoinitiator with the binder.

The UV absorber 134 may absorb h-line UV rays having the wavelength of about 405 nm, the g-line UV rays having the wavelength of about 436 nm, as well as the i-line UV rays having the wavelength of about 365 mm. For example, the UV absorber 134 may have an extinction coefficient of about $214.3 \times 10^5$ to about $551.5 \times 10^5$ for the i-line UV rays having the wavelength of about 365 mm. In addition, the UV absorber 134 may have an extinction coefficient of about $28.9 \times 10^5$ to about $59.3 \times 10^5$ for the h-line UV rays having the wavelength of about 405 nm, and may have an extinction coefficient of about $3.53 \times 10^5$ to about $8.85 \times 10^5$ for the g-line UV rays having the wavelength of about 436 nm.

The radical scavenger 136 may remove the free radical generated from the photoinitiator due to UV irradiation and may stop generation of the free radical. The radical scavenger 136 may be referred to as a hindered amine light stabilizer (HALS).

The UV absorber 134 prevents irradiation of the diffracted light 164 onto the photosensitive material at the center portion of the contact hole 132 by absorbing the UV rays, and the radical scavenger 136 prevents combination of the free radical with the binder by removing the free radical generated from the photoinitiator due to the diffracted light 164. Accordingly, the residual photosensitive organic material at the center portion of the contact hole 132 due to the diffracted light 164 is prevented.

Although both the UV absorber 134 and the radical scavenger 136 are added to the photosensitive organic material in FIG. 4, the radical scavenger 136 may be omitted and the UV absorber 134 may be added to the photosensitive organic material in another embodiment.

A reactivity of the crosslinker is adjusted to have a relatively higher critical exposure energy density where the photosensitive organic material starts remaining. The reactivity of the crosslinker will be illustrated hereinafter.

Figure 5:
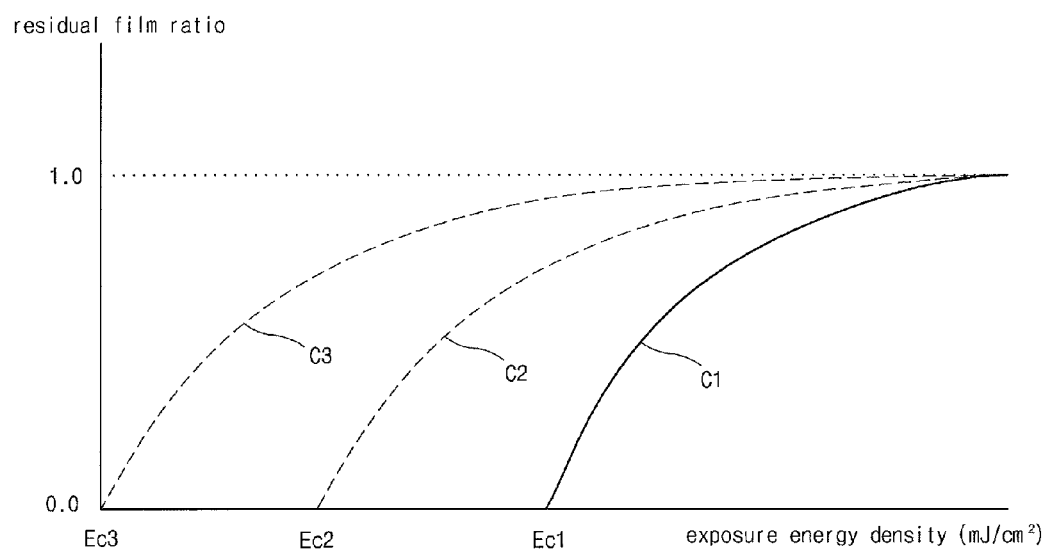
FIG. 5 is a view showing an example of an exposure property of a passivation layer on a substrate for a display device according to an embodiment of the present invention.

FIG. 5 is a view showing an example of an exposure property of a passivation layer on a substrate for a display device according to an embodiment of the present invention.

In FIG. 5, an example of the passivation layer 130 (refer to FIG. 4) is shown including a residual film ratio with respect to an exposure energy density according to a first curve C1, wherein the first curve C1 corresponds to a first critical exposure energy density Ec1. Accordingly, the exposed photosensitive organic material is removed after development even when the diffracted light 164 (refer to FIG. 4) having an exposure energy density smaller than the first critical exposure energy density Ec1 is irradiated onto the photosensitive organic material.

For example, the first critical exposure energy density Ec1 may be determined to be smaller than about 90% of the minimum exposure energy density among various exposure energy densities for display devices having various models or various specifications. The first critical exposure energy density may be about 15 mJ/cm$^2$.

The residual film ratio with respect to the exposure energy density and the critical exposure energy density may be adjusted by an acid value of a multifunctional monomer used as the crosslinker.

For example, when the photosensitive organic material has a property according to a second curve C2, the photosensitive organic material may remain at the center portion of the contact hole 132 (refer to FIG. 4) due to the diffracted light 164 having an exposure energy density smaller than the first critical exposure energy density Ec1 and greater than the second critical exposure energy density Ec2. In addition, when the photosensitive organic material has a property according to a third curve C3, the photosensitive organic material may remain at the center portion of the contact hole 132 due to the diffracted light 164 having a relatively small exposure energy density.

A contact hole formed by using a photosensitive organic material is illustrated hereinafter.

Figure 6:
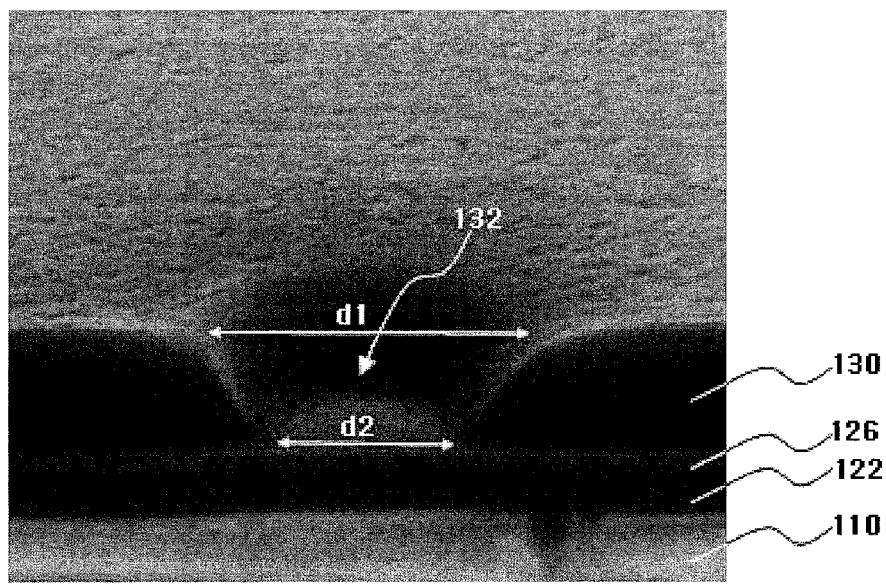
FIG. 6 is a view showing an example of a passivation layer over a substrate for a display device according to an embodiment of the present invention.

FIG. 6 is a view showing an example of a passivation layer over a substrate for a display device according to an embodiment of the present invention.

In FIG. 6, a gate insulating layer 122, a drain electrode 126 and a passivation layer 130 are sequentially formed on a substrate 110 as shown, and the passivation layer 130 includes a contact hole 132 exposing the drain electrode 126.

Uppermost and lowermost portions of the contact hole may have first and second widths d1 and d2, respectively, where no photosensitive organic material remains at a center portion of the contact hole 132. For example, the first and second widths may be about 6.57 μm and 3.14 μm, respectively. Accordingly, the electric characteristics of the pixel electrode 140 (refer to FIG. 3) and the drain electrode 126 through the contact hole 132 are improved and the display quality of the display device is improved.

Although a photosensitive organic material of a negative type is used for the substrate for the display device as shown in the embodiments in FIGS. 3-6, the photosensitive organic material of the positive type may be applied to the substrate for the display device in another embodiment.

In addition, the photosensitive organic material may be applied to the substrate for the display device, wherein the display device includes, for example, a flat panel display (FPD) such as a liquid crystal display (LCD) device, an organic light emitting diode (OLED) display device, or a plasma display panel (PDP).

Consequently, in the substrate for the display device and the method of fabricating the same according to embodiments of the present invention, the aperture ratio and brightness of the display device may be improved since the passivation layer having a fine contact hole is formed using a photosensitive organic material including a UV absorber and a radical scavenger; and a critical exposure energy density of the photosensitive organic material is adjusted.

It will be apparent to those skilled in the art that various modifications and variations can be made in a substrate for a display device of the present disclosure without departing from the sprit or scope of the invention. Thus, it is intended that the present invention covers the modifications and variations of this invention provided they come within the scope of the appended claims and their equivalents.

What is claimed is:

1. A display device, comprising:
   a substrate;
   a thin film transistor on the substrate; and a passivation layer of a photosensitive organic material on the thin film transistor, the passivation layer having a contact hole exposing the thin film transistor, wherein the photosensitive organic material comprises an ultraviolet (UV) absorber, a photoinitiator, and a crosslinker, the UV absorber is configured to absorb reflected UV rays passing by a blocking area in a mask above the contact hole, and the crosslinker links a free radical generated by the photoinitiator when UV rays are irradiated, wherein the crosslinker includes a multifunctional monomer, wherein a critical exposure energy density of the photosensitive organic material is adjusted by an acid value of the multifunctional monomer, and wherein the UV absorber has an extinction coefficient of $(214.3\sim551.5)\times10^5$ for i-line UV rays among the reflected UV rays, an extinction coefficient of $(28.9\sim59.3)\times10^5$ for h-line UV rays among the reflected UV rays, and an extinction coefficient of $(3.53\sim8.85)\times10^5$ for g-line UV rays among the reflected UV rays.

2. The display device according to claim 1, wherein the UV rays reflected from an edge of the blocking area comprise the g-line and h-line UV rays having wavelengths of about 436 nm and 405 nm, respectively.

3. The display device according to claim 1, wherein the ultraviolet absorber absorbs the reflected g-line and h-line UV rays.

4. The display device according to claim 1, wherein the photosensitive organic material further comprises:
a binder which binds the free radical.

5. The display device according to claim 4, wherein the photosensitive organic material further comprises a radical scavenger for removing the free radical.

6. The display device according to claim 1, wherein the blocking area over the passivation area has a width that is the same as a width of the contact hole.

* * * * *